(12) United States Patent
Venuti et al.

(10) Patent No.: US 10,049,801 B2
(45) Date of Patent: Aug. 14, 2018

(54) COMMUNICATION MODULE ALIGNMENT

(71) Applicant: Keyssa Licensing, Inc., Campbell, CA (US)

(72) Inventors: Stephen Robert Venuti, Saratoga, CA (US); Steve Novak, South Lake Tahoe, CA (US)

(73) Assignee: Keyssa Licensing, Inc., Campbell, CA (US)

( * ) Notice: Subject to any disclaimer, the term of this patent is extended or adjusted under 35 U.S.C. 154(b) by 17 days.

(21) Appl. No.: 14/885,953

(22) Filed: Oct. 16, 2015

(65) Prior Publication Data
US 2017/0110229 A1  Apr. 20, 2017

(51) Int. Cl.
| | | |
|---|---|---|
| *H05K 1/18* | (2006.01) | |
| *H01F 7/02* | (2006.01) | |
| *H05K 7/00* | (2006.01) | |
| *H05K 1/14* | (2006.01) | |
| *F23Q 3/00* | (2006.01) | |
| *H01F 13/00* | (2006.01) | |

(52) U.S. Cl.
CPC ............ *H01F 7/0242* (2013.01); *H05K 1/18* (2013.01); *H05K 1/181* (2013.01); *H05K 2201/0707* (2013.01); *H05K 2201/10098* (2013.01); *H05K 2203/104* (2013.01); *H05K 2203/166* (2013.01); *Y02P 70/611* (2015.11)

(58) Field of Classification Search
CPC . B23Q 3/1543; H01F 7/122; H01F 2007/208; H05K 2201/20; H05K 1/02
USPC ....... 361/145, 147, 257, 741, 748, 754, 756, 361/757, 764, 783; 174/353, 391
See application file for complete search history.

(56) References Cited

U.S. PATENT DOCUMENTS

| | | | |
|---|---|---|---|
| 3,796,831 A | | 3/1974 | Bauer |
| 4,485,312 A | | 1/1984 | Kusakabe et al. |
| 4,497,068 A | | 1/1985 | Fischer |
| 4,694,504 A | | 9/1987 | Porter et al. |
| 5,128,835 A | * | 7/1992 | Rudy, Jr. ................ H05K 9/002 361/728 |
| 5,543,808 A | | 8/1996 | Feigenbaum et al. |

(Continued)

FOREIGN PATENT DOCUMENTS

| | | |
|---|---|---|
| EP | 0 515 187 | 11/1992 |
| EP | 1 298 809 | 4/2003 |
| EP | 2 309 608 | 4/2011 |
| EP | 2 360 923 | 8/2011 |
| WO | 2011/114737 | 9/2011 |

(Continued)

OTHER PUBLICATIONS

International Search Report and Written Opinion in PCT/US16/57197, filed Oct. 14, 2016, dated Mar. 17, 2017. 16 pages.

(Continued)

*Primary Examiner* — Binh Tran
(74) *Attorney, Agent, or Firm* — Fish & Richardson P.C.

(57) ABSTRACT

Systems, and apparatus for aligning structures are provided. One of the apparatus includes a first communication module including: a printed circuit board, one or more integrated circuit packages mounted on the printed circuit board, and one or more magnets positioned relative to the one or more integrated circuit packages, wherein the one or more magnets are configured to attractively couple the first communication module to a second communication module positioned in proximity to the first communication module.

14 Claims, 10 Drawing Sheets

(56) References Cited

U.S. PATENT DOCUMENTS

| | | |
|---|---|---|
| 5,621,913 A | 4/1997 | Tuttle et al. |
| 5,754,948 A | 5/1998 | Metze |
| 5,773,878 A | 6/1998 | Lim et al. |
| 5,921,783 A | 7/1999 | Fritsch et al. |
| 5,941,729 A | 8/1999 | Sri-Jayantha |
| 5,956,626 A | 9/1999 | Kaschke et al. |
| 6,351,237 B1 | 2/2002 | Martek et al. |
| 6,490,443 B1 | 12/2002 | Freeny, Jr. |
| 6,492,973 B1 | 12/2002 | Kuroki et al. |
| 6,534,784 B2 | 3/2003 | Eliasson et al. |
| 6,542,720 B1 | 4/2003 | Tandy |
| 6,590,544 B1 | 7/2003 | Filipovic |
| 6,607,136 B1 | 8/2003 | Atsmon et al. |
| 6,718,163 B2 | 4/2004 | Tandy |
| 6,915,529 B1 | 7/2005 | Suematsu et al. |
| 6,967,347 B2 | 11/2005 | Estes et al. |
| 7,107,019 B2 | 9/2006 | Tandy |
| 7,213,766 B2 | 5/2007 | Ryan et al. |
| 7,311,526 B2 | 12/2007 | Rohrbach et al. |
| 7,512,395 B2 | 3/2009 | Beukema et al. |
| 7,517,222 B2 | 4/2009 | Rohrbach et al. |
| 7,593,708 B2 | 9/2009 | Tandy |
| 7,598,923 B2 | 10/2009 | Hardacker et al. |
| 7,599,427 B2 | 10/2009 | Bik |
| 7,612,630 B2 | 11/2009 | Miller |
| 7,617,342 B2 | 11/2009 | Rofougaran |
| 7,656,205 B2 | 2/2010 | Chen et al. |
| 7,664,461 B2 | 2/2010 | Rofougaran et al. |
| 7,760,045 B2 | 7/2010 | Kawasaki |
| 7,761,092 B2 | 7/2010 | Desch et al. |
| 7,768,457 B2 | 8/2010 | Pettus et al. |
| 7,769,347 B2 | 8/2010 | Louberg et al. |
| 7,778,621 B2 | 8/2010 | Tandy |
| 7,791,167 B1 | 9/2010 | Rofougaran |
| 7,820,990 B2 | 10/2010 | Schroeder et al. |
| 7,645,143 B2 | 11/2010 | Rohrbach et al. |
| 7,889,022 B2 | 2/2011 | Miller |
| 7,907,924 B2 | 3/2011 | Kawasaki |
| 7,929,474 B2 | 4/2011 | Pettus et al. |
| 8,014,416 B2 | 9/2011 | Ho et al. |
| 8,036,629 B2 | 10/2011 | Tandy |
| 8,041,227 B2 | 10/2011 | Holcombe et al. |
| 8,063,769 B2 | 11/2011 | Rofougaran |
| 8,081,699 B2 | 12/2011 | Siwiak et al. |
| 8,087,939 B2 | 1/2012 | Rohrbach et al. |
| 8,121,542 B2 | 2/2012 | Zack et al. |
| 8,183,935 B2 | 5/2012 | Milano et al. |
| 8,244,179 B2 | 8/2012 | Dua |
| 8,279,611 B2 | 10/2012 | Wong et al. |
| 8,339,258 B2 | 12/2012 | Rofougaran |
| 8,794,980 B2 | 8/2014 | McCormack |
| 2004/0214621 A1 | 10/2004 | Ponce De Leon et al. |
| 2005/0140436 A1 | 6/2005 | Ichitsubo et al. |
| 2006/0038168 A1 | 2/2006 | Estes et al. |
| 2006/0051981 A1 | 3/2006 | Neidlein et al. |
| 2006/0159158 A1 | 7/2006 | Moore et al. |
| 2007/0024504 A1 | 2/2007 | Matsunaga |
| 2007/0063056 A1 | 3/2007 | Gaucher et al. |
| 2007/0229270 A1 | 10/2007 | Rofougaran |
| 2007/0278632 A1 | 12/2007 | Zhao et al. |
| 2008/0089667 A1 | 4/2008 | Grady et al. |
| 2008/0112101 A1 | 5/2008 | McElwee et al. |
| 2008/0150799 A1 | 6/2008 | Hemmi et al. |
| 2008/0150821 A1 | 6/2008 | Koch et al. |
| 2008/0159243 A1 | 7/2008 | Rofougaran |
| 2008/0192726 A1 | 8/2008 | Mahesh et al. |
| 2008/0195788 A1 | 8/2008 | Tamir et al. |
| 2008/0290959 A1 | 11/2008 | Ali et al. |
| 2009/0006677 A1 | 1/2009 | Rofougaran |
| 2009/0009337 A1 | 1/2009 | Rofougaran |
| 2009/0037628 A1 | 2/2009 | Rofougaran |
| 2009/0075688 A1 | 3/2009 | Rofougaran |
| 2009/0094506 A1 | 4/2009 | Lakkis |
| 2009/0175323 A1 | 7/2009 | Chung |
| 2009/0218407 A1 | 9/2009 | Rofougaran |
| 2009/0218701 A1 | 9/2009 | Rofougaran |
| 2009/0236701 A1 | 9/2009 | Sun et al. |
| 2009/0239392 A1 | 9/2009 | Sumitomo et al. |
| 2009/0239483 A1 | 9/2009 | Rofougaran |
| 2009/0245808 A1 | 10/2009 | Rofougaran |
| 2009/0280765 A1 | 11/2009 | Rofougaran et al. |
| 2010/0127804 A1 | 5/2010 | Vouloumanos |
| 2010/0159829 A1 | 6/2010 | McCormack |
| 2010/0202499 A1 | 8/2010 | Lee et al. |
| 2010/0231452 A1 | 9/2010 | Babakhani et al. |
| 2010/0277394 A1 | 11/2010 | Haustein et al. |
| 2010/0283700 A1 | 11/2010 | Rajanish et al. |
| 2010/0285634 A1 | 11/2010 | Rofougaran |
| 2010/0297954 A1 | 11/2010 | Rofougaran et al. |
| 2011/0047588 A1 | 2/2011 | Takeuchi et al. |
| 2011/0181484 A1 | 7/2011 | Pettus et al. |
| 2011/0207425 A1 | 8/2011 | Juntunen et al. |
| 2011/0285606 A1 | 11/2011 | De Graauw et al. |
| 2011/0286703 A1 | 11/2011 | Kishima et al. |
| 2011/0311231 A1 | 12/2011 | Ridgway et al. |
| 2012/0028582 A1 | 2/2012 | Tandy |
| 2012/0064664 A1 | 3/2012 | Yamazaki et al. |
| 2012/0069772 A1 | 3/2012 | Byrne et al. |
| 2012/0083137 A1 | 4/2012 | Rohrbach et al. |
| 2012/0263244 A1 | 10/2012 | Kyles et al. |
| 2012/0286049 A1 | 11/2012 | McCormack et al. |
| 2012/0290760 A1 | 11/2012 | McCormack et al. |
| 2012/0295539 A1 | 11/2012 | McCormack et al. |
| 2012/0307932 A1 | 12/2012 | McCormack et al. |
| 2012/0319496 A1 | 12/2012 | McCormack et al. |
| 2012/0319890 A1 | 12/2012 | McCormack et al. |
| 2013/0070817 A1 | 3/2013 | McCormack et al. |
| 2013/0106673 A1 | 5/2013 | McCormack et al. |
| 2013/0109303 A1 | 5/2013 | McCormack et al. |
| 2013/0183903 A1 | 7/2013 | McCormack et al. |
| 2014/0072312 A1 | 3/2014 | Aldana et al. |
| 2015/0065069 A1 | 3/2015 | McCormack et al. |

FOREIGN PATENT DOCUMENTS

| | | |
|---|---|---|
| WO | 2011/114738 | 9/2011 |
| WO | 2012/129426 | 9/2012 |
| WO | 2012/155135 | 11/2012 |
| WO | 2012/166922 | 12/2012 |
| WO | 2012/174350 | 12/2012 |
| WO | 2013/006641 | 1/2013 |
| WO | 2013/040396 | 3/2013 |
| WO | 2013/059801 | 4/2013 |
| WO | 2013/059802 | 4/2013 |
| WO | WO 2015/070321 | 5/2015 |

OTHER PUBLICATIONS

Eric A. Juntunen, "60 GHz CMOS Pico-Joule/Bit Ook Receiver Design for Multi-Gigabit Per Second Wireless Communications," Thesis for the Degree of Master of Science in Electrical and Computer Engineering, Aug. 2008, 52 pages.

Future Technology Devices International Limited (FTDI), "Technical Note TN_113 Simplified Description of USB Device Enumeration", Doc. Ref. No. FT_000180, Version 1.0, Issue Date Oct. 28, 2009, 19 pages.

Office of Engineering and Technology Federal Communications Commission, "Understanding the FCC Regulations for Low-Power, Non-Licensed Transmitters", OET Bulletin No. 63, Oct. 1993, 34 pages.

Vahle Electrification Systems, "CPS Contactless Power System", Catalog No. 9d/E, 2004, [retrieved on Feb. 23, 2018], retrieved from: URL <http://webcache.googleusercontent.com/search?q=cache:dZNUxaZm81EJ:www.payestegan.com/uploads/d0wnload/vahle%2520production/CPS_Contactless_Power_Supply_e.pdf+&cd=1&hl=en&ct=clnk&gl=us> 17 pages.

International Preliminary Report on Patentability in International Application No. PCT/US2016/057197, dated Apr. 17, 2018, 10 pages.

* cited by examiner

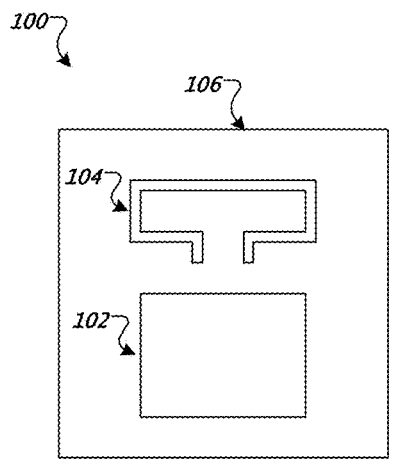
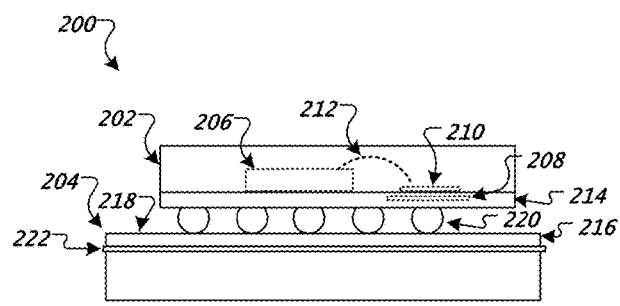
FIG. 1          FIG. 2
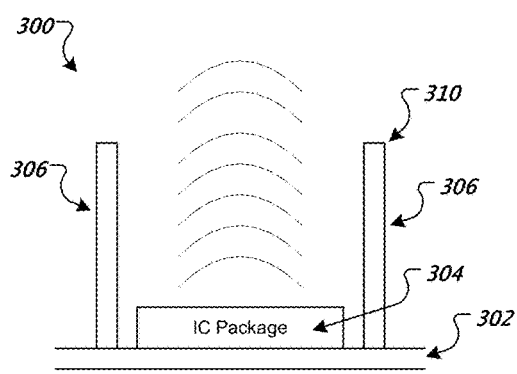
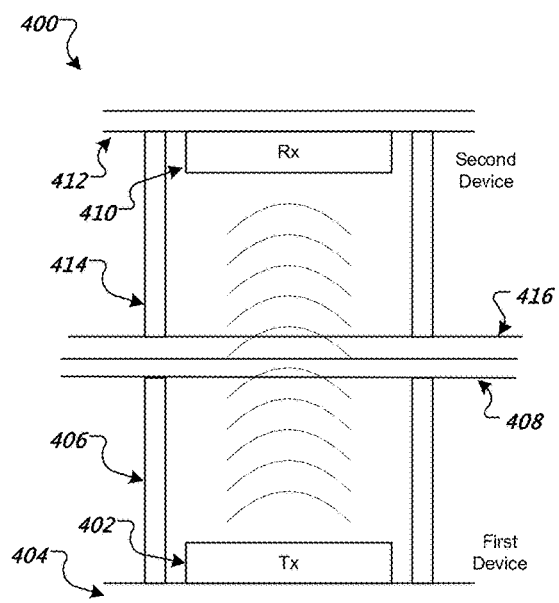
FIG. 3          FIG. 4

COMMUNICATION MODULE ALIGNMENT

BACKGROUND

This specification relates to electromagnetic communications. Advances in semiconductor manufacturing and circuit design technologies have enabled the development and production of integrated circuits (ICs) with increasingly higher operational frequencies. In turn, electronic products and systems incorporating high frequency integrated circuits are able to provide greater functionality than previous generations of products. The additional functionality has typically included the processing of increasingly larger amounts of data at increasingly higher speeds.

Many conventional electronic systems include multiple printed circuit boards (PCBs) upon which ICs are mounted, and through which various signals are routed to and from the ICs. In electronic systems with at least two PCBs and the need to communicate information between the PCBs, a variety of connector and backplane architectures have been developed to facilitate information flow between PCBs. However, conventional connector and backplane architectures typically introduce a variety of impedance discontinuities into the signal path, resulting in a degradation of signal quality or integrity. Connecting to PCBs by conventional means, e.g., signal-carrying mechanical connectors, generally creates discontinuities, requiring expensive electronics to negotiate. Conventional mechanical connectors may also wear out over time, require precise alignment and manufacturing methods, and are susceptible to mechanical jostling.

SUMMARY

In general, one innovative aspect of the subject matter described in this specification can be embodied in an apparatus including a first communication module including: a printed circuit board, one or more integrated circuit packages mounted on the printed circuit board, and one or more magnets positioned relative to the one or more integrated circuit packages, wherein the one or more magnets are configured to attractively couple the first communication module to a second communication module positioned in proximity to the first communication module.

The foregoing and other embodiments can each optionally include one or more of the following features, alone or in combination. In particular, one embodiment includes all the following features in combination. Each of the integrated circuit packages comprises one or more of a transmitter or a receiver. The first communication module further comprises a respective signal guiding structure surrounding a perimeter formed by each of the one or more integrated circuit packages, wherein each signal guiding structure is configured to insulate the respective integrated circuit package from extraneous signals and to form a channel providing a pathway for data communications. The one or more magnets include a one or more magnets surrounding a portion of each signal guiding structure. The one or more magnets includes a center magnet positioned between a first signal guiding structure and a second signal guiding structure. The one or more integrated circuit packages comprises a transmitter integrated circuit package and a receiver integrated circuit package. The one or more magnets comprise one or more magnets surrounding at least a portion of the transmitter integrated circuit package and one or more magnets surrounding at least a portion of the receiver integrated circuit package. The one or more magnets further comprise a central magnet positioned between the transmitter integrated circuit package and the receiver integrated circuit package. The first communication module is configured to move between an engaged position and a disengaged position. Moving the first communication module between the engaged position and the disengaged position comprises moving the printed circuit board. The printed circuit board is biased to the disengaged position when the one or more magnets are not attracted to magnets of the second communication module. The one or more magnets includes a magnet configured to move between an engaged position and a disengaged position. The magnet is biased to the disengaged position when the one or more magnets are not attracted to magnets of the second communication module.

In general, one innovative aspect of the subject matter described in this specification can be embodied in an apparatus including a communication module including: one or more integrated circuit packages, one or more magnets, and a movable printed circuit board, wherein the one or more integrated circuit packages and the one or more magnets are positioned relative to the movable printed circuit board such that they move with the movable printed circuit board; and a housing, wherein the movable printed circuit board is positioned relative to the housing such that in an engaged position the printed circuit board is positioned closer to a surface of the housing than in an disengaged position.

The foregoing and other embodiments can each optionally include one or more of the following features, alone or in combination. In the engaged position, the one or more integrated circuit packages and the one or more magnets are positioned closer to the surface of the housing than in the disengaged position. In the disengaged position a strength of a magnetic field from the one or more magnets at the surface of the housing is less than a specified threshold, and wherein in the engaged position the strength of the magnetic field from the one or more magnets at the surface of the housing is greater than the specified threshold. Movement of the movable printed circuit board is provided by a spring that biases the movable printed circuit board to the disengaged position. Movement of the movable printed circuit board is provided by a magnetic bias structure positioned relative to a surface of the printed circuit board facing opposite the one or more communication modules. Movement of the movable printed circuit board is provided by a compressible material.

At least one of the one or more integrated circuit packages comprises a transmitter. At least one of the one or more integrated circuit packages comprises a receiver. The communication module includes comprises a first signal guiding structure surrounding a first integrated circuit package and a second signal guiding structure surrounding a second integrated circuit package. The one or more magnets comprise one or more magnets surrounding at least a portion of the first signal guiding structure and one or more magnets surrounding at least a portion of the second signal guiding structure. The one or more magnets further comprise a central magnet positioned between the first signal guiding structure and the second signal guiding structure. The housing is formed of non-metallic material. The housing is formed of a metallic material, the apparatus further comprising one or more one or more non-metallic portions positioned in cutouts of the metallic housing, wherein the one or more non-metallic portions are positioned relative to the one or more integrated circuit packages. One or more galvanic contacts are positioned on the surface of the housing and electronically coupled to the movable printed circuit board.

In general, one innovative aspect of the subject matter described in this specification can be embodied in an apparatus including a communication module including: one or more integrated circuit packages configured to transmit or receive data, one or more magnets including one or more movable magnets configured to move between an engaged and a disengaged position, and a printed circuit board, wherein the one or more integrated circuit packages and the one or more magnets are positioned relative to the printed circuit board; and a housing, wherein the printed circuit board is positioned relative to the housing such that one or more integrated circuit packages are configured to transmit or receive data through a surface of the housing.

In general, one innovative aspect of the subject matter described in this specification can be embodied in an apparatus including a communication module including: one or more integrated circuit packages configured to transmit or receive data, one or more magnets, and a printed circuit board, wherein the one or more integrated circuit packages and the one or more magnets are positioned relative to the printed circuit board; and a housing, wherein the printed circuit board is positioned relative to the housing such that one or more integrated circuit packages are configured to transmit or receive data through a surface of the housing.

In general, one innovative aspect of the subject matter described in this specification can be embodied in an system including a first device comprising: one or more first integrated circuit packages, and one or more first magnets; a second device comprising: one or more second integrated circuit packages, and one or more second magnets; wherein, in response to positioning the first device in a particular relation to the second device, the one or more first magnets and the one or more second magnets provide alignment between the respective first and second one or more integrated circuit packages.

The details of one or more embodiments of the invention are set forth in the accompanying drawings and the description below. Other features, objects, and advantages of the invention will be apparent from the description and drawings, and from the claims.

BRIEF DESCRIPTION OF DRAWINGS

FIG. 1 is an overhead view of an example IC package.

FIG. 2 shows a side view representation of an example communication device including an IC package FIG. 3 is a side view of an example communication module including a signal guiding structure.

FIG. 4 is a side view diagram illustrating an example of communication between a transmitter and a receiver.

Like reference symbols in the various drawings indicate like elements.

DETAILED DESCRIPTION

Figure 5:
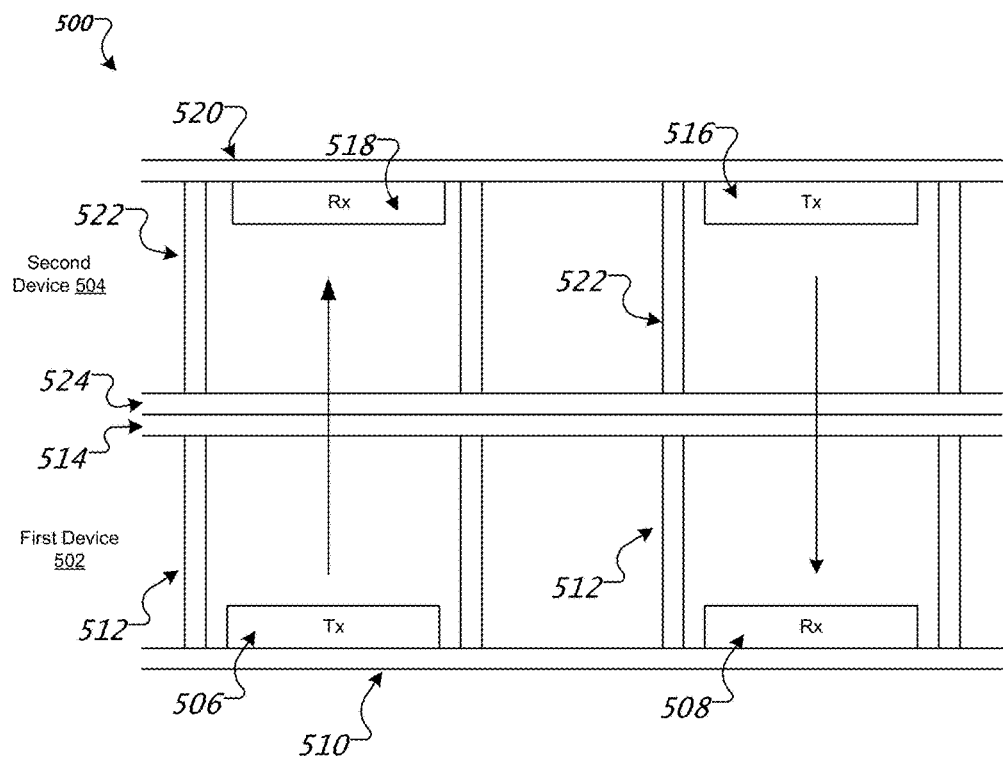
FIG. 5 shows a side view diagram illustrating an example of communication between a pair of communication modules.

This specification describes alignment structures for wireless communication. Wireless communication may be used to provide signal communications between components on a device or may provide communication between devices.

In one example, tightly-coupled transmitter/receiver pairs may be deployed with a transmitter disposed at a terminal portion of a first conduction path and a receiver disposed at a terminal portion of a second conduction path. The transmitter and receiver may be disposed in close proximity to each other depending on the strength of the transmitted energy, and the first conduction path and the second conduction path may not be contiguous with respect to each other. In some examples, the transmitter and receiver may be disposed on separate circuit carriers positioned with the antennas of the transmitter/receiver pair in close proximity.

A transmitter and/or receiver may be configured as an integrated circuit (IC) package, in which one or more antennas may be positioned adjacent to a die and held in place by a dielectric or insulating encapsulation or bond material. An antenna may also be held in place by a lead frame substrate. Examples of antennas embedded in IC packages are shown in the drawings and described below. Note that IC packages may also be referred to as simply packages, and are examples of wireless communication units that are also variously referred to as communication units, communication devices, comm-link chips, comm-link chip assemblies, comm-link chip packages, and/or comm-link packages, which may be configured in various ways. For example, IC packages, communication units, communication devices, comm-link chips, comm-link chip assemblies, comm-link chip packages, and/or comm-link packages may each include one or more ICs, chips, or dies and have circuit functionality appropriate for particular applications.

FIG. 1 shows an example IC package 100. The IC package 100 includes a die 102 and a transducer 104 providing conversion between electrical and electromagnetic (EM) signals. The IC package 100 may include additional structures, for example, conductive connectors, such as bond wires, electrically connecting the transducer to bond pads connected to a transmitter or receiver circuit included in die 102. The IC package 100 further includes an encapsulating material 106 formed around at least a portion of the die 102 and/or the transducer 104. In the example IC package 100, the encapsulating material 104 completely covers the die 100 and the transducer 104.

The die 102 includes any suitable structure configured as a circuit on a suitable die substrate. In some implementations, the die can alternatively be referred to as a chip or an integrated circuit. The die substrate may be composed of any suitable semiconductor material, for example, silicon. In some implementations, the die 102 has a length and a width dimension each of substantially 1.0 mm to about 2.0 mm. The die 102 may be mounted with electrical conductors, such as a lead frame, not shown in FIG. 1, electrically coupling the die 102 to one or more external circuits. The IC package 100 can further include a transformer to provide impedance matching between a circuit on the die 102 and the transducer 104.

The transducer 104 may be in the form of a folded dipole or loop antenna and is configured to transmit and/or receive electromagnetic signals. In some implementations, the antenna is configured to operate at radio frequencies including radio frequencies in the extremely high frequency (EHF) band of the electromagnetic spectrum, e.g., frequencies from 30 to 300 gigahertz. As shown in IC package 100, the antenna is separate from the die 102, but is coupled to the die 102 by suitable conductors, not shown.

The dimensions of the antenna are determined such that they are suitable for operation in the specified frequency band of the electromagnetic spectrum, e.g., the EHF band.

In one example, a loop configuration of the antenna can be configured to include a substantially 0.1 mm band of material, laid out in a loop substantially 1.4 mm long and substantially 0.53 mm wide, with a gap of substantially 0.1 mm at the mouth of the loop, and with the edge of the loop approximately 0.2 mm from the edge of die 102.

The encapsulating material 106 can be used to assist in holding the various components of IC package 100 in fixed relative positions. The encapsulating material 106 may be formed from a suitable material configured to provide electrical insulation and physical protection for the components of IC package 100. Additionally, the encapsulating material 106 can be selected from a material that does not impede, or that optimizes passage of, signals to or from the transducer 104. For example, the encapsulating material 106 can be composed of glass, plastic, or ceramic. The encapsulating material 106 may also be formed in any suitable shape. For example, the encapsulating material 106 may be in the form of a rectangular block, encapsulating all components of the IC package 100 except for any unconnected ends of conductors connecting the die 102 to external circuits.

FIG. 2 shows a side view representation of an example communication device 200 including an IC package 202 mounted to a PCB 204. The IC package 202 includes a die 206, a ground plane 208, an antenna 210, and one or more bond wires 212 connecting the die 206 to the antenna 210. The die 206 and antenna 210 are mounted on a package substrate 214 and encapsulated in an encapsulating material. The ground plane 208 is within the package substrate 214 and is a suitable structure configured to provide an electrical ground for the antenna 210. The ground plane 208 can extend the entire length of the package substrate 214 or just a portion, in particular, a portion underneath the antenna 210. The PCB 204 includes a top dielectric layer 216 having a surface 218. The IC package 202 is mounted to the surface 218 with mounting bumps 220 attached to a metallization pattern (not shown).

The PCB 204 also optionally includes a layer 222 spaced from dielectric layer 216 made of conductive material forming a ground plane within the PCB 204. The PCB ground plane may be any suitable structure configured to provide an electrical ground to circuits and components on the PCB 204.

FIG. 3 is a side view of an example communication module 300 including a signal guiding structure. As shown in FIG. 3, the communication module 300 includes a PCB 302, an IC package 304, and a signal guiding structure 306 providing a signal pathway. The communication module 300, can include a transmitter or receiver for transmitting or receiving signals, e.g., radio frequency signals.

In particular, the IC package 304 can correspond to the IC packages described above with respect to FIGS. 1 and 2. The IC package 304 is mounted on the PCB 302. For example, the IC package 304 can be mounted to the PCB as described with respect to FIG. 2.

The communication module 300 can be configured to transmit or receive data using radio frequency communication. For example, if the communication module 300 includes a transmitter, the communication module 300 can transmit data, which can then be received by a receiver, e.g., of another communication module.

The signal guiding structure 306 is configured to aid in directing radio frequency (RF) signals as well as to reduce interference from spurious signals. The signal guiding structure 306 can surround a perimeter of the IC package and extend in the direction of signal transmission and/or reception by a specified amount to provide a channel for emitted or received RF signals. For example, the signal guiding structure 306 can have a height 310 suitable for a particular device including the communication module 300 and that allows the signal guiding structure 306 to be positioned in proximity to a corresponding signal guiding structure of another communication module when used to communicate with another device. The signal guiding structure can be composed of a suitable material that is configured to reduce extraneous signals without disrupting passage of communications along the channel formed by the signal guiding structure 306.

FIG. 3 illustrates one IC package 304 mounted to the PCB 302. However, in other implementations, more than one IC package can be mounted to the same PCB 302.

The communication module 300 can be part of a communication system of a device, e.g., a computer, mobile phone, tablet, kiosk, or other device/system. The communication system can be configured to provide wireless communication using one or more IC packages. For example, the communication system can include two IC packages, one configured as a transmitter and the other configured as a receiver. The communication system can be in communication with a storage device. Thus, for example, the communication system can transfer data between the data storage unit and an external device using wireless communication provided by the IC packages.

FIG. 4 is a side view diagram 400 illustrating an example of communication between a transmitter and a receiver. For example, a user of a first device may wish to exchange data with a second device. The two devices can be positioned in proximity to each other such that the respective communication modules for transmitting and receiving data are aligned and in range of each other. In particular, for EHF frequencies, the devices may need to be very close to each other. For example, the devices may need to be in physical contact to facilitate data communication.

In FIG. 4, a first device includes a first communication module having a transmitter IC package 402 positioned on a first PCB 404. The transmitter IC package 402 is surrounded by a first signal guiding structure 406 forming a channel. The first signal guiding structure 406 extends to a surface of a first housing 408 of the first device. For example, the first device can be a first mobile phone and the first housing 408 can correspond to the outer case of the first mobile phone.

A second device includes a second communication module having a receiver IC package 410 positioned on a second PCB 412. The receiver IC package 410 is surrounded by a second signal guiding structure 414 forming a channel. The second signal guiding structure 414 extends to a surface of a second housing 416 of the second device. For example, the second device can be a second mobile phone and the second housing 416 can correspond to the outer case of the second mobile phone.

As illustrated by diagram 400, the first signal guiding structure 406 and the second signal guiding structure 414 are aligned and an outer surface of the first housing 408 and the second housing 416 are in physical contact to provide minimal communication distance and interference.

A data transmission from the transmitter IC package 402 passes along the first signal guiding structure 406 and the second signal guiding structure 414 to the receiving IC package 410.

FIG. 5 shows a side view diagram 500 illustrating an example of communication between a pair of transmitters and receivers. Diagram 500 includes a portion of a first device 502 and a second device 504.

The first device 502 includes a first transmitter IC package 506 and a first receiver IC package 508 mounted to a first PCB 510. Each of the first transmitter IC package 506 and the first receiver IC package 508 is encircled by a respective first signal guiding structure 512. The first signal guiding structure 512 forms a channel extending to a surface of a first housing 514 of the first device 502. For example, the first device 502 can be a first mobile phone and the first housing 514 can correspond to the outer case of the first mobile phone.

The second device 504 includes a second transmitter IC package 516 and a second receiver IC package 518 mounted to a second PCB 520. Each of the second transmitter IC package 516 and the second receiver IC package 518 is encircled by a respective second signal guiding structure 522. The second signal guiding structure 522 provides a channel extending to a surface of a second housing 524 of the second device 502. For example, the second device 502 can be a second mobile phone and the second housing 524 can correspond to the outer case of the second mobile phone.

As shown in FIG. 5, the first signal guiding structures 512 and the second signal guiding structures 522 are substantially aligned on either side of the respective first and second housings 514, 524. The alignment minimizes loss from a data transmission from the first transmitter IC package 506 to the second receiver IC package 518 and from the second transmitter IC package 516 to the first receiver IC package 508.

Figure 6:
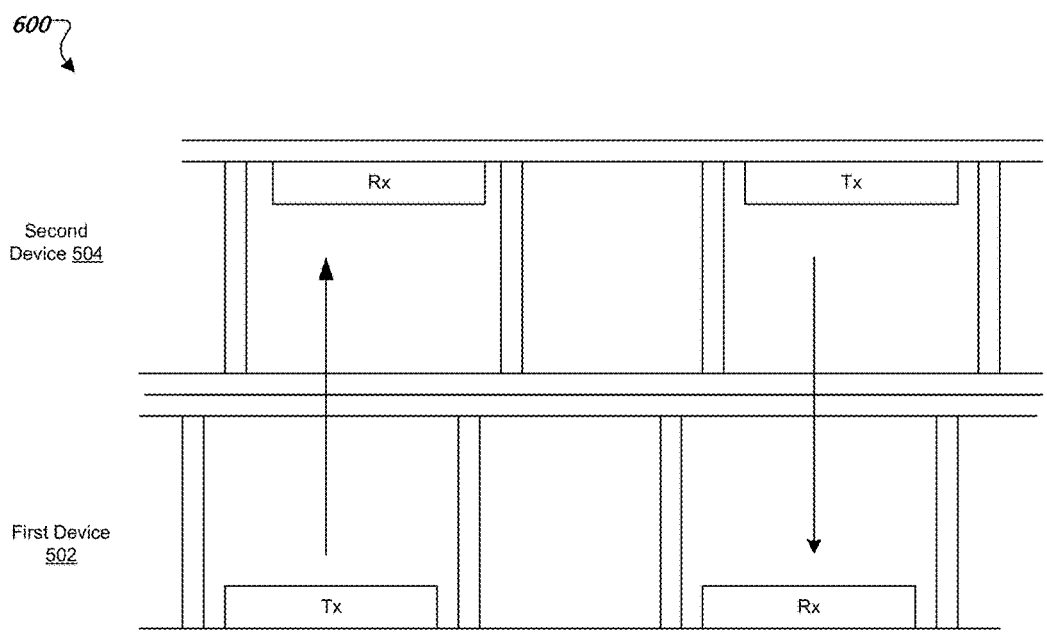
FIG. 6 shows a side view diagram illustrating an example of a misaligned pair of transmitters and receivers.

By contrast, FIG. 6 shows a side view diagram 600 illustrating an example of a misaligned pair of transmitters and receivers. In particular, diagram 600 illustrates the portion of the first device 502 and the second device 504 of FIG. 5 where the respective signal guiding structures are not aligned. For example, the first device 502 and second device 504 may both be mobile devices. When placed next to each other to communicate data, the devices may not be aligned perfectly such that the signal guiding structures are aligned within a specified tolerance.

For example, the transmitter and receiver IC packages of each device can operate in the EHF band and require a high degree of alignment to prevent signal degradation or loss. In some implementations, the signal guiding structures are preferably aligned within 0.5 mm. Thus, even a small amount of misalignment can result in signal loss between respective transmitters and receivers of the devices. Additionally, in the example shown in FIGS. 4-5, a particular orientation of the first and second devices may be needed to align a respective transmitter with a respective receiver.

This specification describes alignment structures for aligning the signal guiding structures for data communication. Additionally, the alignment structures can also provide for galvanic and/or wireless transfer of power between devices. In some implementations, the alignment structures are configured to provide alignment in x, y, and z directions, relative to a device surface, of within 0.5 mm. Additionally, the alignment structures can be configured to have a footprint less than or equal 16 mm×8 mm.

As described below, alignment within the specified tolerance can be facilitated using one or more magnets. The alignment can be achieved while keeping the magnetic field at the surface of each device within a specified threshold, e.g., less than 2000 gauss, when not coupled together. While not necessary, coupling can be performed, e.g., for data communication and/or power transfer. The threshold can be set to reduce the risk of damaging magnetically encoded information positioned near the device, e.g., a credit card with a magnetic strip placed on a phone case.

Figures 7A, 7B:
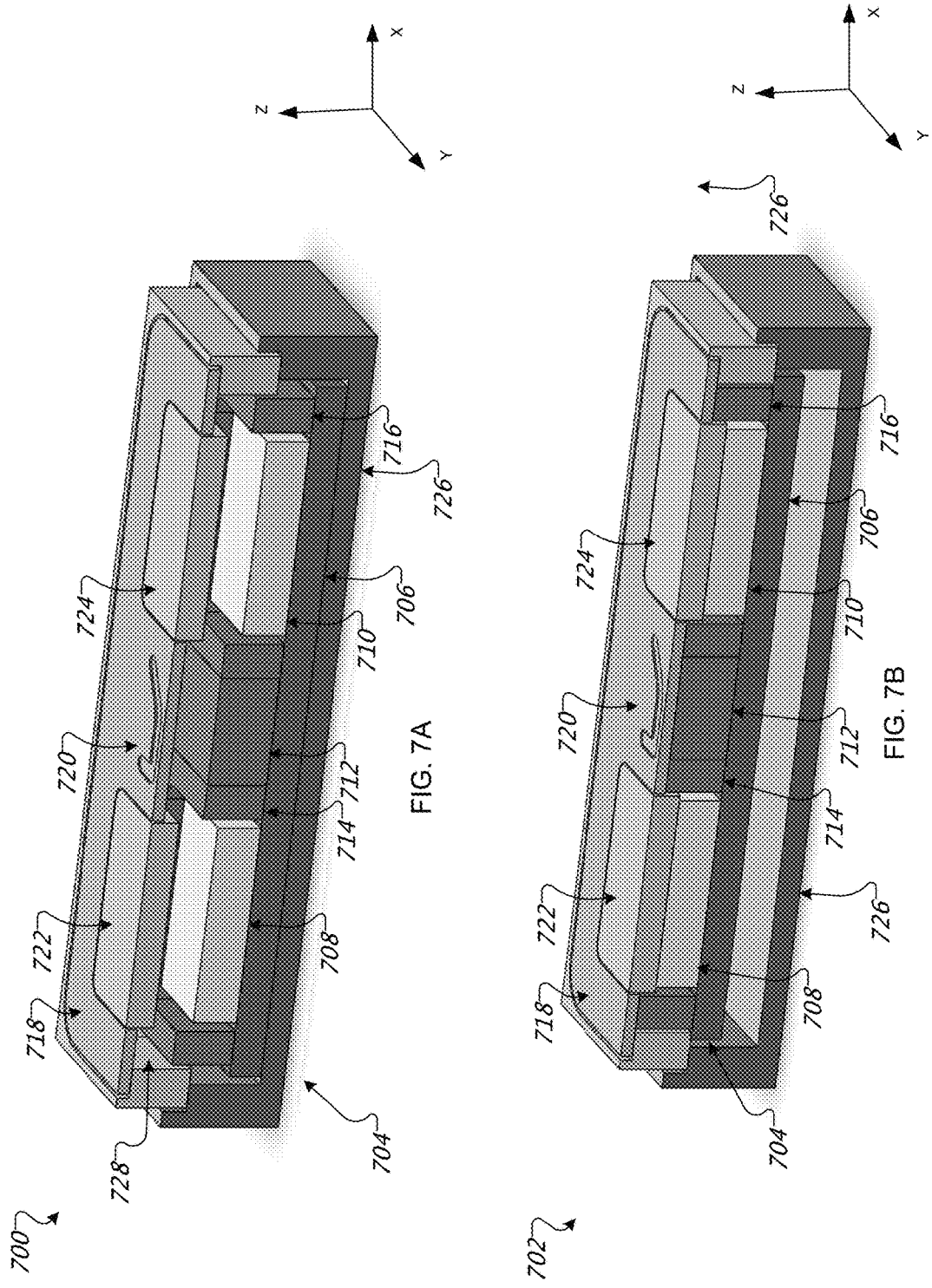
FIG. 7A is a cross-sectional diagram of an example first alignment structure in a disengaged position.
FIG. 7B is a cross-sectional diagram of the example first alignment structure in an engaged position.

FIG. 7A is a cross-sectional diagram 700 of an example first alignment structure for data communication in a disengaged position. FIG. 7B is a cross-sectional diagram 702 of the example first alignment structure for data communication in an engaged position. Having an engaged and disengaged position, as described below, allows stronger magnets to be used to guide and hold alignment when engaged while maintaining the surface magnetic field below the specified threshold when disengaged.

As shown in FIGS. 7A and 7B, the alignment structure includes a movable communication module 704. The movable communication module 704 includes a PCB 706. Mounted on the PCB 706 are a first IC package surrounded by a first signal guiding structure 708, a second IC package surrounded by a second signal guiding structure 710, a center magnet 712, a first ring magnet 714 surrounding at least a portion of the first signal guiding structure 708, and a second ring magnet 716 surrounding at least a portion of the second signal guiding structure 710. The first and second IC packages, PCB 706, and first and second signal guiding structures 708, 710 can be similar to those described above with respect to FIGS. 1-6. For example, the first IC package can operate as a transmitter and the second IC package can operate as a receiver. In some other implementations, both the first and second IC package can be of the same type, e.g., both transmitters, both receivers, or one or more of the IC packages can include transceivers configured to operate selectively as either transmitter or receiver.

In the disengaged position, the movable communication module 704 is recessed from a housing portion 718. The housing portion 718 can be an insert or an integral portion of a device housing, for example, a case of a mobile device. Thus, in the disengaged position, the movable communication module 704 is recessed so that there is a gap 728 between the communication module 704 and the housing portion 718. The gap 728 can ensure that the magnetic field at the outer surface of the housing portion 718 is less than the specified threshold.

The housing portion 718 can be integrated into a housing for a device, for example, part of a case for a mobile device. The housing portion 718 can include a visual identifier 720 to provide a rough alignment to the communication module 704 allowing the device to be positioned in proximity to another communication module, e.g., having a corresponding visual identifier. In some implementations, the visual identifier 720 includes a recess or raised portion of the outer surface to aid in the rough alignment between communication modules.

The housing portion 718 also includes non-metallic panels 722 and 724. These non-metallic panels are positioned over the transmission path to or from the IC packages to ensure that data communications pass without interference from the housing portion 718. For example, if the case of the mobile device is metal, the non-metallic panels prevent the metallic case from interfering with the RF signals of the data communication. In some other implementations, the portion of the device case including the housing portion 718 is non-metallic and therefore the non-metallic panels can be omitted from the housing portion 718. Regardless of whether the non-metallic panels are present, the particular part of the housing positioned over the transmission path to or from the IC packages is composed of a material configured to allow data transmission and in some cases optimize data transmission. Thus, for example, the housing could be formed of one or more non-metallic materials having different data transmission characteristics as long as the material over the IC transmission path provides for data transmission.

The center magnet 712 is positioned between the ring magnets 714 and 716. The center magnet 712 can be shaped, for example, as a rectangular box or cuboid. The ring magnets 714 and 716 can be formed from one or more magnets. For example, a number of magnet segments can be combined to form each ring magnet. Each ring magnet can partially or wholly surround an outside edge of the corresponding signal guiding structure. For example, in some implementations, one or more of the ring magnets can be U-shaped such that they partially surround the signal guiding structures. In some implementations, the sides of the ring magnets perpendicular to the PCB 706 can also be angled off axis from perpendicular and can be non-uniform in thickness.

In some other implementations, the ring magnets also act as the signal guiding structures such that only the ring magnets are present and positioned similarly to the corresponding ring guiding structures.

One or more of the magnets can be configured to guide the communication module to an aligned position with an opposing communication module when positioned in proximity to each other (e.g., using the visible identifier 720 as an initial alignment structure).

In some implementations, one or more of the magnets are configured to align with and attract a corresponding magnet of a second communication module. For example, the first ring magnet 714 can have a top surface, z-axis, corresponding to a north pole and the second ring magnet 716 can have a top surface, z-axis, corresponding to a south pole. When a second, identical communication module, having a particular orientation, is positioned above the first communication module, the north pole of the first ring magnet will attract a south pole of a ring magnet of the second communication module. Similarly the south pole of the second ring magnet will attract a north pole of a ring magnet of the second communication module.

In some other implementations, one or more of the magnets can be engineered to include a particular alignment pattern of north and south poles along the z-axis. The pattern of magnetic north and south poles are used to program how tightly the magnets attract and hold one another as well as to define how the attraction falls off as the magnets are moved laterally. The patterns can be constructed to form a particular magnetic field so that two magnets will attract most strongly when they are perfectly aligned and repel when shifted laterally, thus guiding the magnets to an aligned position. An example of magnets constructed to have a particular magnetic field pattern is described in the White Paper "Smart Magnets for Precision Alignment" located at http://www.polymagnet.com/media/Polymagnet-White-Paper-3-Smart-Magnets-for-Precision-Alignment-.pdf, and incorporated by reference.

As shown in FIG. 7B, in the engaged position the communication module 704 is raised such that the magnets and the signal guiding structures are in close proximity to the housing portion 718. In some implementations, the distance traversed between the engaged and disengaged positions is substantially 1 mm. For example, the signal guiding pathways 708, 710 may be raised so that a top edge is in contact with the housing portion 718. By being in contact with the housing portion 718, the signal loss due to distance or through the sides of the channel formed by the signal guiding pathways can be reduced.

Additionally, in the engaged position the magnets are raised so that a maximum magnetic force along the x, y, and z-axis can be applied to corresponding magnets of a second communication module, e.g., of a second device. The maximum magnetic force can be configured to align the signal guiding structures of each communication module for data communication. For example, in some implementations, the magnetic force along a z-axis, e.g., toward another communication module being aligned, is greater than 13 newtons. Although some specific examples of magnetic force are provided here and in the implementations described below, the maximum amount of magnetic force at the housing surface can be variable dependent upon design considerations and types/strengths of magnets used. A minimum magnetic force may be necessary to obtain a desired alignment hold, e.g., 10 newtons, depending on the specific design and whether there is a mechanical hold to provide a shear force that reduces the magnetic force required.

Various suitable structures can be employed to provide the movement of the communication module 704 from the engaged position to the disengaged position. In some implementations, one or more springs are used to provide a bias force moving the movable communication module 704 to the disengaged position. The force applied by the springs can be less than the magnetic attraction between magnets of opposing communication modules. As a result, when, for example, two devices are placed in proximity to each other, the attraction between the opposing magnets is greater than the force biasing the communication module 704 in the disengaged position, thereby moving the communication module 704 to the engaged position.

In some other implementations, a magnetic bias is provided below the movable communication module 704. For example, a base 726 can be positioned below the PCB 706 as part of or as a separate component from the alignment structure. The base 726 can include a metallic portion or layer over a portion of the base 726 that attracts the one or more magnets. As with the force of the one or more springs, the attractive force provided by the magnetic bias can be less than the magnetic attraction between magnets of opposing communication modules such that when, for example, two devices are placed in proximity to each other the magnets attract resulting in the communication module 704 moving to the engaged position.

In another implementation, a compressible material is positioned between the magnets and the housing portion 718. The compressible material can be a material, e.g., rubber, that is compressed when the magnets are attracted to magnets of an opposing communication module such that the movable communication module 704 moves to the engaged position. When the opposing communication module is removed, the elastic nature of the compressible material restores the shape of the gasket material pushing the movable communication module 704 to the disengaged position.

Figure 8:
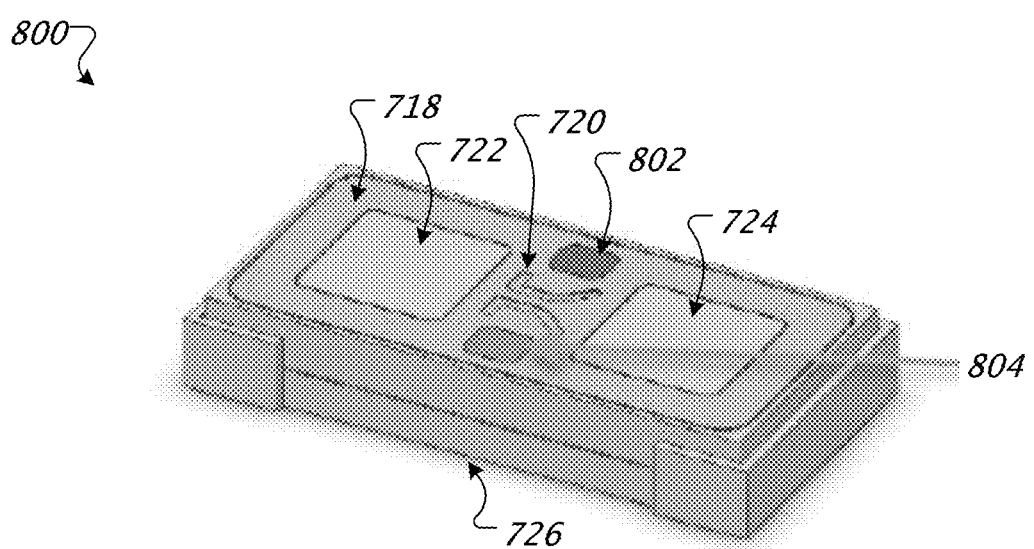
FIG. 8 is a diagram of an example of the first alignment structure including power transfer.

FIG. 8 is a diagram 800 of the first example alignment structure for data communication including power transfer. In particular, diagram 800 shows the housing portion 718 and base 726 for the alignment structure. The housing portion 718 includes the non-metallic panels 722 and 724 positioned over the transmission path to or from the IC packages to ensure that data communications pass without interference from the housing portion 718. If the housing portion 718 is formed of a non-metallic material, the non-metallic panels 722 and 724 can be omitted.

The housing portion also includes galvanic contacts 802 and 804. The galvanic contacts 802 and 804 provide a transfer of electrical energy when placed in contact with a corresponding galvanic contacts of a second alignment structure. For example, a mobile phone having the alignment structure incorporated into the phone housing can position the phone relative to an alignment structure incorporated into another device, e.g., a computer or kiosk. When the alignment structures are positioned in proper alignment, one or more of data transfer and energy transfer can occur. For example, the mobile device can be charged while also transferring data or charged without data transfer. One or more of the galvanic contacts 802 and 804 can be electrically coupled to the PCB of the alignment structure, e.g., PCB 706 of FIGS. 7A-B. The galvanic contacts 802 and 804 can provide enough power, e.g., 6 watts, to charge a corresponding device.

Figure 9:
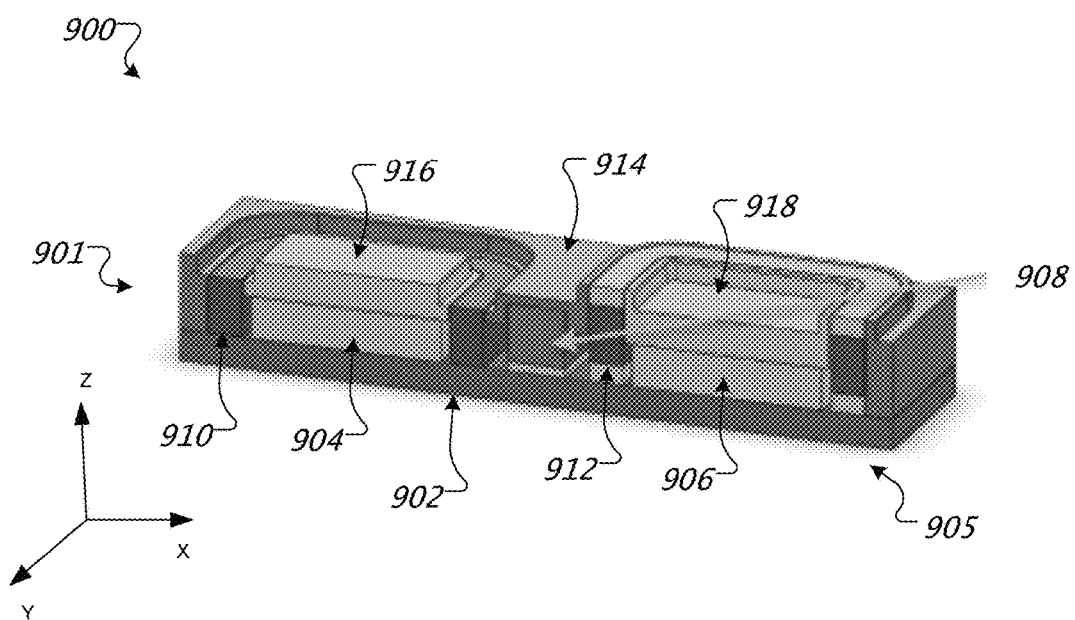
FIG. 9 is a cross-sectional diagram of an example second alignment structure.

FIG. 9 is a cross-sectional diagram 900 of an example second alignment structure 901. The alignment structure 901 includes a communication module 905 including a PCB 902. Mounted on the PCB 902 are a first IC package surrounding by a first signal guiding structure 904, a second IC package surrounding by a second signal guiding structure 906, a movable center magnet 908, a first ring magnet 910 surrounding at least a portion of the first signal guiding structure 904, and a second ring magnet 912 surrounding at least a portion of the second signal guiding structure 906.

The first and second IC packages, PCB 902, and first and second signal guiding structures 904, 906 can be similar to those described above with respect to FIGS. 1-6. For example, the first IC package can operate as a transmitter and the second IC package can operate as a receiver. In some other implementations, both the first and second IC package can be of the same type, e.g., both transmitters, or one or more of the IC packages can operate selectively as either transmitter or receiver.

The center magnet 908 is positioned between the first and second signal guiding structures 904, 906. The center magnet 908 can be shaped, for example, as a rectangular box or cuboid. The center magnet 908 moves between an engaged and a disengaged position. Similar to the first alignment structure described in FIGS. 7A-7B, the center magnet 908 moves to allow a stronger magnet to be used to guide and hold alignment when the center magnet 908 is engaged while also maintaining the surface magnetic field below a specified threshold level when the center magnet 908 is disengaged.

In the disengaged position (not shown), the center magnet 908 is recessed from a housing portion 914. The housing portion 914 can be an insert or an integral portion of a device housing, for example, a case of a mobile device. Thus, in the disengaged position, the center magnet 908 is recessed so that there is a gap between the center magnet 908 and the housing portion 914. Because of the movable center magnet 908, stronger magnets can be used to secure alignment while maintaining a specified threshold magnetic field at the surface of the housing portion 914 when the alignment structure is disengaged. In the engaged position, the center magnet 908 is positioned near to or is touching the housing portion 914 such that the gap between the center magnet 908 and the housing portion 914 is reduced or eliminated. The engaged position of the center magnet 908 increases the overall magnetic field strength at the surface of the housing portion 914, x, y, and z-axis, and provides the attachment alignment between coupled communication modules.

The movement of the center magnet 908 between the engaged and disengaged position can be provided by a suitable structure that biases the center magnet 908 in the disengaged position when not in proximity to another communication module, for example, using the spring, magnetic bias, or compressible material structures and/or mechanisms described above.

The ring magnets 910 and 912 can be formed from one or more magnets. For example, a number of magnet segments can be combined to form each ring magnet. Similar to the ring magnets 714 and 716 of FIGS. 7A-B, each ring magnet can partially or wholly surround an outside edge of the corresponding signal guiding structure. For example, one or more of the ring magnets can be U-shaped such that they partially surround the signal guiding structures.

One or more of the magnets can be configured to guide the communication module to an aligned position with an opposing communication module when positioned in proximity to each other. The magnets can be similar to the magnets described above with respect to FIGS. 7A-7B. In particular, one or more of the magnets can be configured with a particular pattern that guides opposing magnets to an aligned position when placed in proximity to each other.

Because only the center magnet 908 is movable, the overall magnetic force when engaged can be less than the magnetic force of the alignment structure described above with respect to FIGS. 7A-7B. For example, in the example shown in FIGS. 7A-7B the maximum magnetic force, z-axis, in the engaged position can be greater than 13 newtons. By contrast, in some implementations, the maximum magnetic force, z-axis, with the center magnet 908 engaged can be less than 6 newtons. To increase a shear force when two communication modules are coupled together, the alignment structure 901 includes a recess portion 916 and a protrusion portion 918 to provide a mechanical fit between alignment structures.

The recess portion 916 and the protrusion portion 918 can provide a rough alignment between the first and second signal guiding pathways 904, 906 while the ring magnets and center magnet 908 can provide the fine alignment. In some implementations, the recess portion 916 has a recess from a surface of the housing portion 914 of substantially 1 mm. In some implementations, the protrusion portion 918 has a protrusion from a surface of the hosing portion 914 of substantially 1 mm. In some other implementations different heights (or depths) of the protrusions portion and recess portion are possible including heights of less than 1 mm.

The recess portion 916 and the protrusion portion 918 are positioned to overlay the respective first IC package and the second IC package and formed as part of the housing portion 914. A portion of the recess portion 916 and the protrusion portion 918 can be formed of a non-metallic material to avoid interference with the data communication passing between signal guiding structures of aligned communication modules.

Figure 10:
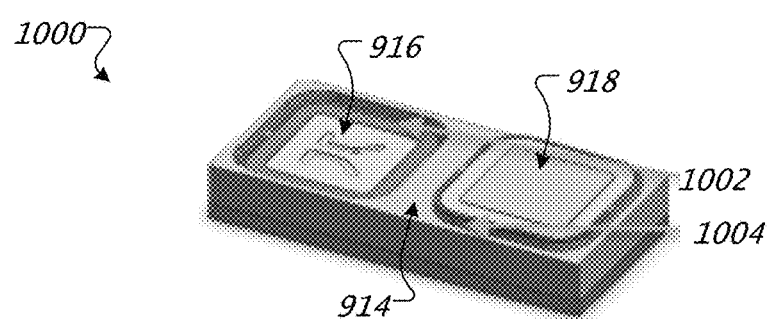
FIG. 10 is a diagram of an example of the second alignment structure including power transfer.

FIG. 10 is a diagram 1000 of the second example alignment structure for data communication including power transfer. In particular, diagram 1000 shows the housing portion 914 including the recess portion 916 and protrusion portion 918. The recess portion 916 includes one or more galvanic contacts 1002 positioned along an interior edge of the recess portion 916. The protrusion portion 918 includes one or more galvanic contact 1004 positioned along an outer edge of the protrusion portion 918.

The galvanic contacts 1002 and 1004 provide a transfer of electrical energy when placed in contact with a corresponding galvanic contacts of a second alignment structure. For example, a mobile phone having the alignment structure incorporated into the phone housing can position the phone relative to an alignment structure incorporated into another device, e.g., a computer or kiosk. When the alignment structures are positioned in proper alignment, one or more of data transfer and energy transfer can occur. For example, the mobile device can be charged while also transferring data or charged without data transfer. One or more of the galvanic contacts 1002 and 1004 can be electrically coupled to the PCB of the alignment structure, e.g., PCB 706 of FIGS. 7A-B. The galvanic contacts 1002 and 1004 can provide sufficient power, e.g., 6 watts, to charge a corresponding device. In some implementations, the galvanic contacts are composed of a positive and negative terminal. These terminals can be positioned symmetrically about an axis of the alignment structure. In other implementations, any suitable number of galvanic contacts can be used.

Figure 11:
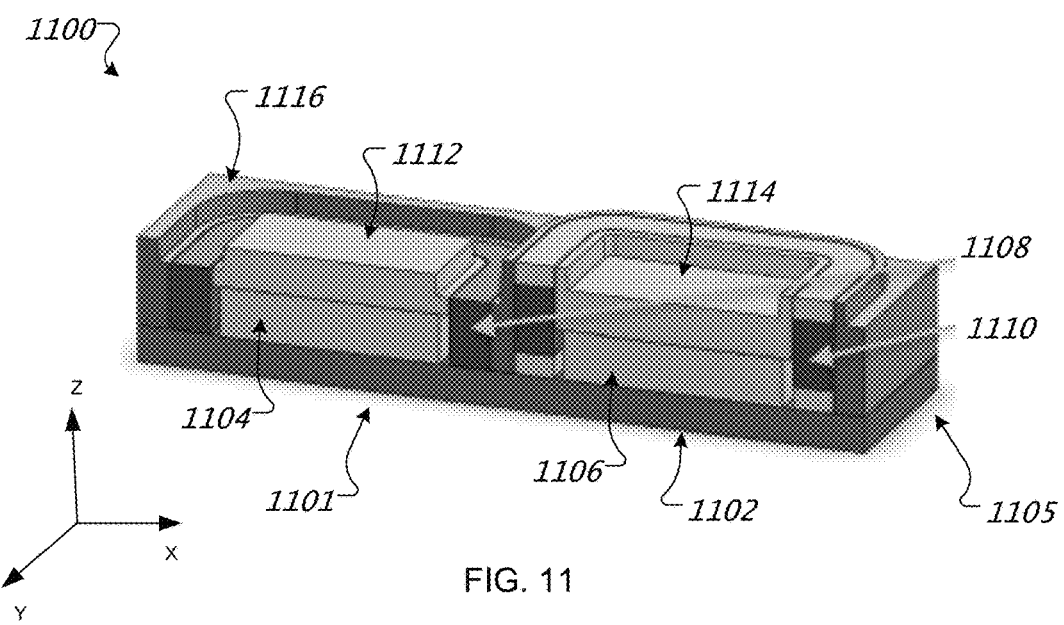
FIG. 11 is a cross-sectional diagram of an example third alignment structure.

FIG. 11 is a cross-sectional diagram 1100 of a third example alignment structure 1101 for data communication. The alignment structure 1101 is similar to the alignment structure 901 except that the central magnet 908 is omitted from communication module 1105. Removing the central magnet results in a more compact footprint for the alignment structure 1101. However, the removal of the central magnet also results in a reduced magnetic force for aligning corresponding communication modules. For example, in some implementations, the overall magnetic force, z-axis, at the surface of the alignment structure 1101 along a z-axis can be less than 4.5 newtons.

The alignment structure 1101 includes a communication module 1105 including a PCB 1102. Mounted on the PCB 1102 are a first IC package surrounding by a first signal guiding structure 1104, a second IC package surrounding by a second signal guiding structure 1106, a first ring magnet 1108 surrounding at least a portion of the first signal guiding structure 1104, and a second ring magnet 1110 surrounding at least a portion of the second signal guiding structure 1106.

The first and second IC packages, PCB 1102, and first and second signal guiding structures 1104, 1106 can be similar to those described above with respect to FIGS. 1-6. The first IC package can operate as a transmitter and the second IC package can operate as a receiver. In some other implementations, both the first and second IC package can be of the same type, e.g., both transmitters, or one or more of the IC packages can operate selectively as either transmitter or receiver.

The ring magnets 1108 and 1110 can be formed from one or more magnets. For example, a number of magnet segments can be combined to form each ring magnet. Similar to the ring magnets 714 and 716 of FIGS. 7A-B, each ring magnet can partially or wholly surround an outside edge of the corresponding signal guiding structure. For example, in some implementations, one or more of the ring magnets can be U-shaped such that they partially surround the signal guiding structures.

One or more of the magnets can be configured to guide the communication module 1105 to an aligned position with an opposing communication module when positioned in proximity to each other. The magnets can be similar to the magnets described above with respect to FIGS. 7A-7B. In particular, one or more of the magnets can be configured with a particular pattern that guides opposing magnets to an aligned position when placed in proximity to each other.

Because the overall magnetic force is lower without a center magnet or one or more movable magnets, the alignment structure 1101 includes a recess portion 1112 and a protrusion portion 1114 to provide a mechanical fit between alignment structures and to increase the shear force when two alignment structures are coupled together.

The recess portion 1112 and the protrusion portion 1114 can provide an initial alignment between the first and second signal guiding pathways 1104, 1106 while the ring magnets can provide a finer degree of alignment. The recess portion 1112 and the protrusion portion 1114 can also serve as a visual indicator of the location of the IC packages. In some implementations, the recess portion 1112 has a recess from a surface of a housing portion 1116 of substantially 1 mm. In some implementations, the protrusion portion 1114 has a protrusion from a surface of the hosing portion 1116 of substantially 1 mm.

The recess portion 1112 and the protrusion portion 1114 are positioned to overlay the respective first IC package and the second IC package and formed as part of the housing portion 1116. A portion of the recess portion 1112 and the protrusion portion 1114 can be formed of a non-metallic material to avoid interference with the data communication passing between signal guiding structures of aligned communication modules.

Figure 12:
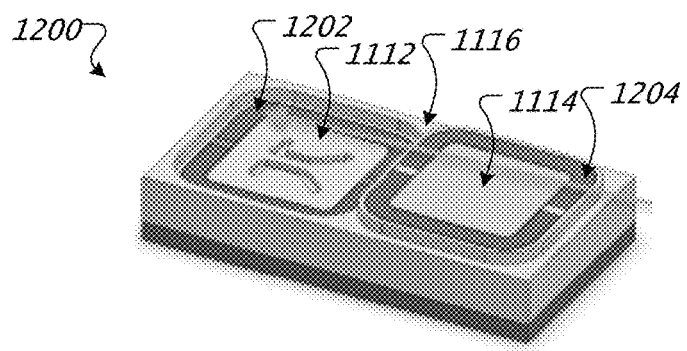
FIG. 12 is a diagram of an example of the third alignment structure including power transfer.

FIG. 12 is a diagram 1200 of the third example alignment structure for data communication including power transfer. In particular, diagram 1200 shows the housing portion 1116 including the recess portion 1112 and protrusion portion 1114. The recess portion 1112 includes one or more galvanic contacts 1202 positioned along a perimeter of the recess provided by the portion 1112. The protrusion portion 1114 includes one or more galvanic contacts 1204 positioned along a perimeter of the protrusion provided by the protrusion portion 1114.

The galvanic contacts 1202 and 1204 provide a transfer of electrical energy when placed in contact with a corresponding galvanic contacts of a second alignment structure. For example, a mobile phone having the alignment structure incorporated into the phone housing can position the phone relative to an alignment structure incorporated into another device, e.g., a computer or kiosk. When the alignment structures are positioned in proper alignment, one or more of data transfer and energy transfer can occur. For example, the mobile device can be charged while also transferring data or charged without data transfer. One or more of the galvanic contacts 1202 and 1204 can be electrically coupled to the PCB of the alignment structure, e.g., PCB 706 of FIGS. 7A-B. The galvanic contacts 1202 and 1204 can provide sufficient power, e.g., 6 watts, to charge a corresponding device.

FIGS. 13A-D are diagrams illustrating example placements of galvanic contacts. Other suitable number, placements, and terminal structures can be used.

Figure 13A:
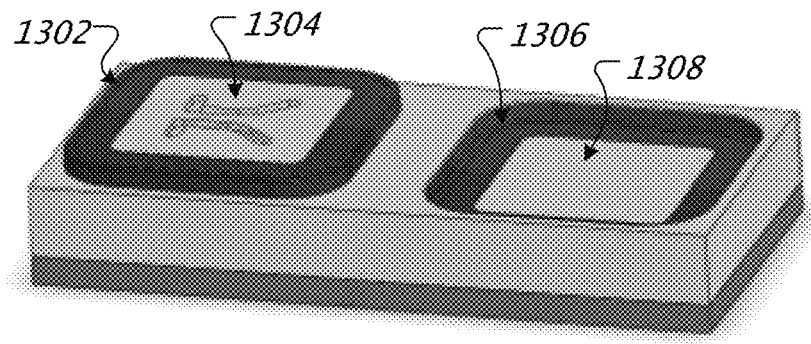
FIGS. 13A-D are diagrams illustrating example placements of galvanic contacts.

In FIG. 13A, a first galvanic contact 1302 is positioned to surround a portion of a protrusion portion 1304 and a second galvanic contact 1306 is positioned to surround a portion of a recess portion 1308. In particular, the first galvanic contact 1302 surrounds an outer edge of the protrusion portion 1304 as well as a perimeter of a top of the protrusion portion 1304. The second galvanic contact 1306 surrounds an inner edge of the recess portion 1308 as well as a portion of a top of the recess portion 1308, e.g., a portion extending from an edge of each side of the top by a specified amount. Each galvanic contact is split into positive and negative terminals. For example, one-half of the contact forms the positive terminal and one half forms the negative terminal. An insulating material or a spacer can exist between the positive and negative halves. The galvanic connections shown are symmetric around the X axis to ensure that the power terminal of a first device connects to a power terminal of a second device and similarly as to the respective ground terminals. As shown in FIG. 13A the positive and negative terminals are symmetric for each galvanic contact, however, in some implementations the orientation of the terminals can be different.

Figure 13B:
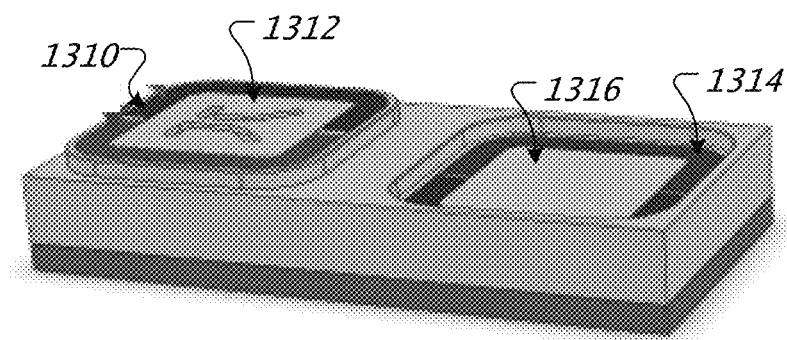

In FIG. 13B, a first galvanic contact 1310 is positioned to surround a perimeter of a top of a protrusion portion 1312. A second galvanic contact 1314 is positioned to surround a perimeter of a top of a recess portion 1316. Each galvanic contact is split into positive and negative terminals. As shown in FIG. 13B the positive and negative terminals are oppositely oriented for each galvanic contact, however, in some implementations the orientation of the terminals can be different.

Figure 13C:
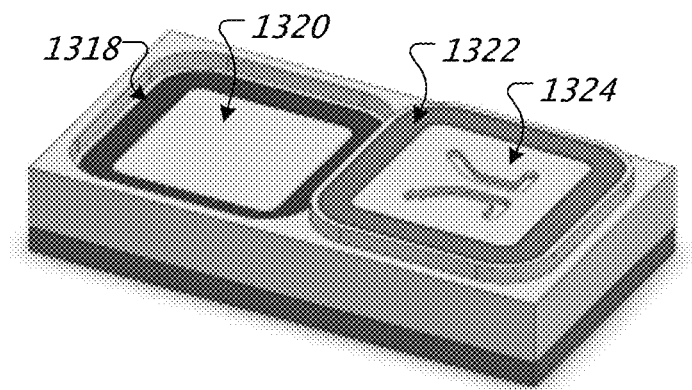

In FIG. 13C, a first galvanic contact 1318 is positioned to surround a perimeter of a top of a recess portion 1320. A second galvanic contact 1322 is positioned to surround a perimeter of a top of a protrusion portion 1324. Each galvanic contact forms a respective positive and negative terminal. For example, the first galvanic contact 1318 can be the positive terminal and the second galvanic contact 1322 can be the negative terminal.

Figure 13D:
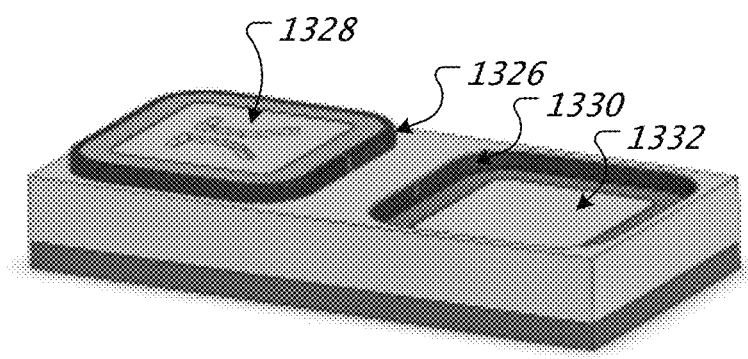

In FIG. 13D, a first galvanic contact 1326 is positioned to surround an outside edge of a protrusion portion 1328. A second galvanic contact 1330 is positioned to surround an inside edge of a recess portion 1332. Each galvanic contact is split into positive and negative terminals. As shown in FIG. 13D the positive and negative terminals are symmetrically oriented for each galvanic contact, however, in some implementations the orientation of the terminals can be different.

Figure 14:
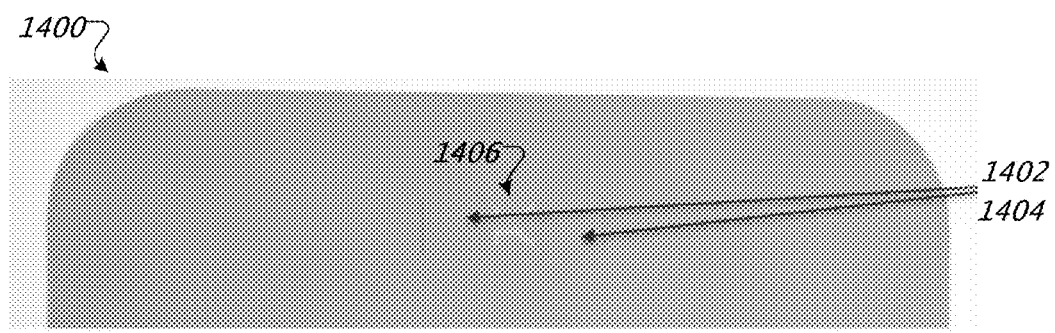
FIG. 14 shows an example device housing using the first alignment structure.

FIG. 14 shows an example device housing 1400 using the first alignment structure. In particular, the device housing 1400 can be a metallic housing, e.g., for a mobile device. Because of the metallic housing, non-metallic portions 1402, 1404 are included in the housing corresponding to the locations of signal guiding structures. A visual indicator 1406 can be used to provide an initial rough alignment of the communication module using the first alignment structure with another device including another communication module. Alternatively, if a non-metallic material is used for the device housing 1400, the non-metallic portions 1402 and 1404 can be omitted.

Figure 15:
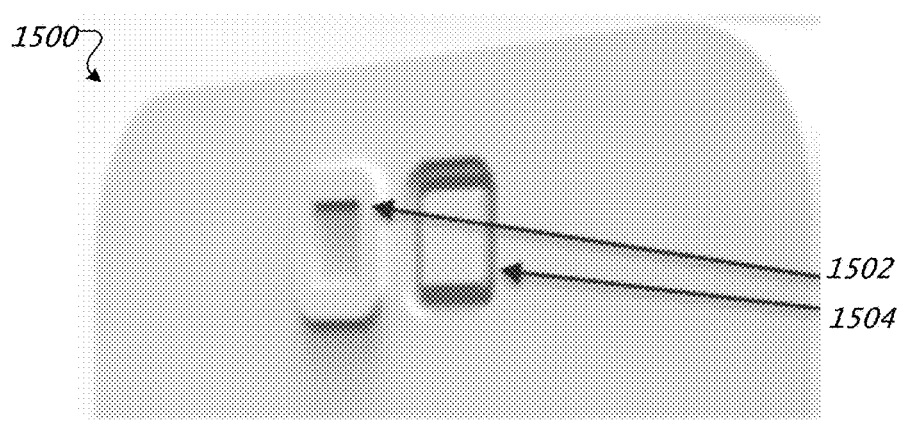
FIG. 15 shows an example device housing using the second alignment structure.
Figure 16:
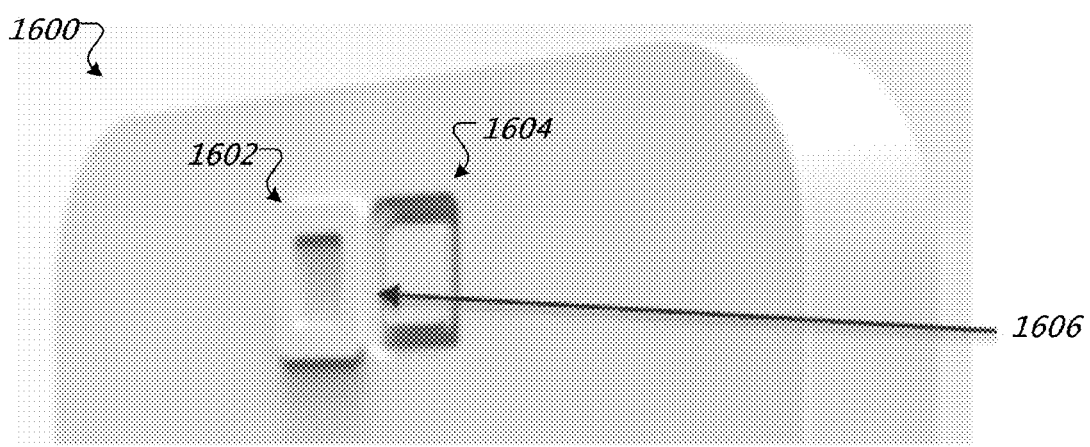
FIG. 16 shows an example device housing using the third alignment structure.

FIG. 15 shows an example device housing 1500 using the second alignment structure. In particular, the housing 1500 includes a protrusion portion 1502 and a recess portion 1504. The protrusion portion 1502 and recess portion 1504 correspond to the locations of underlying signal guiding structures. The protrusion portion 1502 and recess portion 1504 provide a visual indicator of the location of the communication module as well as provide a mechanical fit between communication modules. The mechanical fit provides a rough alignment as well as increases shear force needed to separate two devices coupled together, e.g., for data communication. In some implementations, the height of the protrusion portion 1502 above the surface of the device housing 1500 and the depth of the recess portion 1504 below the surface of the device housing 1500 is substantially 0.5 mm. In some implementations, non-metallic portions are included when the housing 1500 is formed from a metallic material FIG. 16 shows an example device housing 1600 using the third alignment structure. In particular, the housing 1600 includes a protrusion portion 1602 and a recess portion 1604. The protrusion portion 1602 and recess portion 1604 correspond to the locations of underlying signal guiding structures. Because the third alignment structure does not include a center magnet, a spacing 1606 between the protrusion portion 1602 and the recess portion 1604 is less than that between the protrusion portion 1502 and the recess portion 1504 of FIG. 15.

The protrusion portion 1602 and recess portion 1604 provide a visual indicator of the location of the communication module as well as provide a mechanical fit between communication modules. The mechanical fit provides a rough alignment as well as increases shear force needed to separate two devices coupled together, e.g., for data communication. In some implementations, non-metallic portions are included when the housing 1600 is formed from a metallic material The alignment structures described in this specification can be used with communication modules included in various types of devices. These devices can have differing shapes and sizes. In some implementations, one or more additional magnets can be added to the device housing to maintain adequate alignment force between coupled devices.

Figure 17:
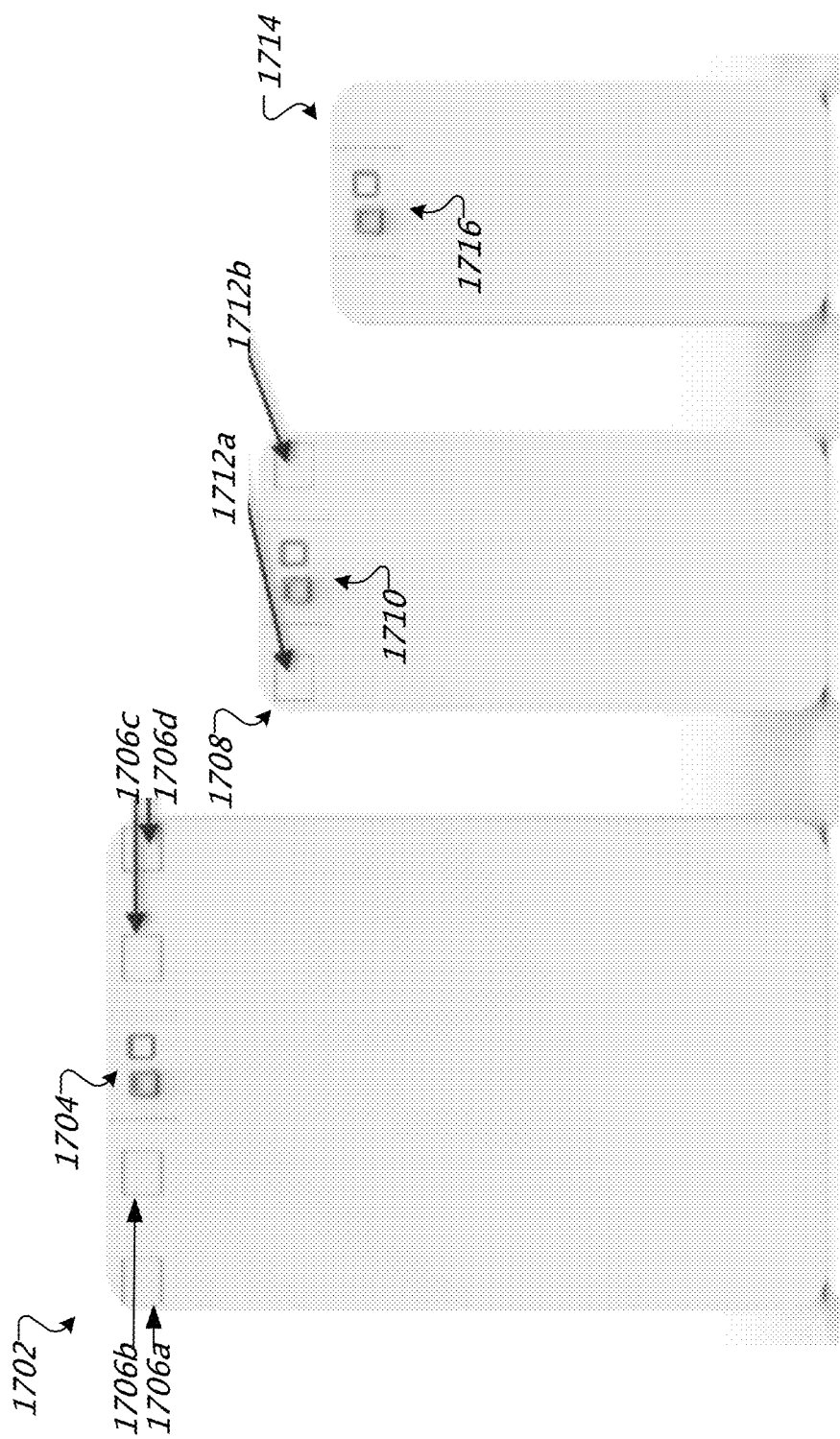
FIG. 17 shows example device housings with additional magnets.

FIG. 17 shows example device housings with additional magnets. A first housing 1702 can correspond, for example, to a tablet device. The first housing 1702 includes an alignment structure 1704 including a protrusion portion and a recess portion. The first housing 1702 further includes additional magnets 1706a-d. These additional magnets 1706a-d can be engaged to help maintain alignment when the first housing 1702 is coupled to devices of different sizes. For example, when coupled to a communication module that is part of another tablet device, all of the additional magnets 1706a-d may be engaged with corresponding magnets of the other tablet device.

By contrast, when coupled to a communication module that is part of a smaller device such as the device illustrated by a second housing 1708, only the inner two additional magnets 1706b-c may be engaged. Finally, when coupled to a communication module of an even smaller device such as the device illustrated by a third housing 1714 (e.g., a mobile phone), none of the additional magnets 1706a-d are used.

The second housing 1708 can correspond, for example, to a large format smartphone. The second housing 1708 includes an alignment structure 1710 including a protrusion portion and a recess portion. The second housing 1708 further includes additional magnets 1712a-b. These additional magnets 1712a-b can be engaged to help maintain alignment when the second housing 1708 is coupled to devices of different sizes.

The third housing 1714 can correspond, for example, a smartphone. The third housing 1714 includes magnets as part of an alignment structure 1716 including a protrusion portion and a recess portion. However, the third housing 1714 does not include any additional magnets.

While this specification contains many specific implementation details, these should not be construed as limitations on the scope of any inventions or of what may be claimed, but rather as descriptions of features specific to particular embodiments of particular inventions. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Thus, particular embodiments of the subject matter have been described. Other embodiments are within the scope of the following claims. In some cases, the actions recited in the claims can be performed in a different order and still achieve desirable results. In addition, the processes depicted in the accompanying figures do not necessarily require the particular order shown, or sequential order, to achieve desirable results. In certain implementations, multitasking and parallel processing may be advantageous.

What is claimed is:

1. An apparatus comprising:
a first communication module of a first device including:
a printed circuit board,
one or more integrated circuit packages mounted on the printed circuit board, wherein each of the one or more integrated circuit packages comprise a wireless transceiver, transmitter, or receiver, and
one or more magnets positioned relative to the one or more integrated circuit packages,
wherein the one or more magnets are configured to move within the first device such that, when in an engaged position, the one or more magnets attractively couple the first communication module to a second communication module of a second device positioned in proximity to the first communication module.

2. The apparatus of claim 1, wherein the first communication module further comprises a respective signal guiding structure surrounding a perimeter formed by each of the one or more integrated circuit packages, wherein each signal guiding structure is configured to insulate the respective integrated circuit package from extraneous signals and to form a channel providing a pathway for data communications.

3. The apparatus of claim 2, wherein the one or more magnets include one or more magnets surrounding a portion of each signal guiding structure.

4. The apparatus of claim 2, wherein the one or more magnets includes a center magnet positioned between a first signal guiding structure and a second signal guiding structure.

5. The apparatus of claim 1, wherein the one or more integrated circuit packages comprises a transmitter integrated circuit package and a receiver integrated circuit package.

6. The apparatus of claim 5, wherein the one or more magnets comprise one or more magnets surrounding at least a portion of the transmitter integrated circuit package and one or more magnets surrounding at least a portion of the receiver integrated circuit package.

7. The apparatus of claim 5, wherein the one or more magnets further comprise a central magnet positioned between the transmitter integrated circuit package and the receiver integrated circuit package.

8. The apparatus of claim 1, wherein the first communication module is configured to move within the first device between an engaged position and a disengaged position.

9. The apparatus of claim 8, wherein moving the first communication module between the engaged position and the disengaged position comprises moving the printed circuit board.

10. The apparatus of claim 9, wherein the printed circuit board is biased to the disengaged position when the one or more magnets are not attracted to magnets of the second communication module.

11. The apparatus of claim 1, wherein at least one of the magnets is biased to a disengaged position when the one or more magnets are not attracted to magnets of the second communication module.

12. The apparatus of claim 8, wherein the first communication module moves to the engaged position in response to the second communication module being positioned in proximity to the first communication module.

13. The apparatus of claim 12, wherein the magnets in the engaged position align at least one of the one or more integrated circuit packages with an integrated circuit package of the second communication module.

14. An apparatus comprising:
a first device comprising:
a movable communication module including:
a printed circuit board,
one or more integrated circuit packages mounted on the printed circuit board, wherein each of the one or more integrated circuit packages comprise a wireless transceiver, transmitter, or receiver, and
one or more magnets positioned relative to the one or more integrated circuit packages,
wherein the movable communication module is configured to move within the first device between an engaged position and a disengaged position, wherein the movable communication module is in an engaged position when coupled to a second device and in a disengaged position when not coupled to the second device.

* * * * *